(12) United States Patent
Minkin et al.

(10) Patent No.: US 10,285,306 B1
(45) Date of Patent: May 7, 2019

(54) POWER SUPPLY

(71) Applicant: LISTAN GmbH & Co. KG, Glinde (DE)

(72) Inventors: Stanislav Minkin, Glinde (DE); Christian-Michael Rex, Glinde (DE)

(73) Assignee: LISTAN GMBH & CO. KG, Glinde (DE)

( * ) Notice: Subject to any disclaimer, the term of this patent is extended or adjusted under 35 U.S.C. 154(b) by 0 days.

(21) Appl. No.: 15/826,106

(22) Filed: Nov. 29, 2017

(51) Int. Cl.
H05K 7/20 (2006.01)
H05K 5/03 (2006.01)
H05K 7/14 (2006.01)

(52) U.S. Cl.
CPC ........... H05K 7/20154 (2013.01); H05K 5/03 (2013.01); H05K 7/1427 (2013.01); H05K 7/209 (2013.01); H05K 7/20909 (2013.01)

(58) Field of Classification Search
CPC ... H05K 7/20154; H05K 5/03; H05K 7/20172
See application file for complete search history.

(56) References Cited

U.S. PATENT DOCUMENTS

| | | | | |
|---|---|---|---|---|
| 5,478,221 A | * | 12/1995 | Loya | F04D 29/601 257/E23.099 |
| 6,074,296 A | | 6/2000 | Wu | |
| 2003/0137807 A1 | * | 7/2003 | Chen | H01L 23/467 361/697 |
| 2003/0202879 A1 | * | 10/2003 | Huang | F04D 25/0613 415/220 |
| 2005/0030711 A1 | * | 2/2005 | Tsai | G06F 1/20 361/679.48 |
| 2005/0110366 A1 | * | 5/2005 | Chang | F04D 19/024 310/268 |
| 2005/0219821 A1 | * | 10/2005 | Lai | H01L 23/467 361/704 |
| 2006/0078427 A1 | * | 4/2006 | Hsieh | F04D 25/0613 415/206 |
| 2007/0098544 A1 | * | 5/2007 | Wang | F04D 19/007 415/126 |
| 2007/0128022 A1 | * | 6/2007 | Yeh | F04D 19/002 415/220 |

(Continued)

*Primary Examiner* — David M Sinclair
*Assistant Examiner* — Robert D Brown
(74) *Attorney, Agent, or Firm* — Muncy, Geissler, Olds & Lowe, P.C.

(57) ABSTRACT

A power supply includes a bottom case, a top cover, a circuit board and a heat-dissipating fan. In this case, the bottom case and the top cover are fitted together to delimit an accommodating space. The circuit board is mounted on the bottom case and located within the accommodating space. The circuit board is provided thereon with a plurality of electronic components and a plurality of heat-dissipating elements, each heat-dissipating element being provided correspondingly to one of the electronic components and allowed to conduct heat, respectively. Each of the heat-dissipating elements is provided with a mounting hole. The heat-dissipating fan includes a supporting frame, a driving module provided on the supporting frame, and a fan blade set covering the driving module and being driven by the driving module to rotate. Moreover, the heat-dissipating fan is not provided with a barrier wall around the fan blade set.

5 Claims, 9 Drawing Sheets

(56) References Cited

U.S. PATENT DOCUMENTS

| | | | | |
|---|---|---|---|---|
| 2007/0154308 A1* | 7/2007 | Yang | F04D 29/384 | 415/220 |
| 2007/0210660 A1* | 9/2007 | Horng | F04D 29/059 | 310/90 |
| 2007/0284955 A1* | 12/2007 | Chang | F04D 19/007 | 310/59 |
| 2008/0247874 A1* | 10/2008 | Acre | F04D 29/584 | 416/95 |
| 2008/0266793 A1* | 10/2008 | Lee | H05K 7/20909 | 361/695 |
| 2008/0277094 A1* | 11/2008 | Peng | F04D 25/0653 | 165/80.3 |
| 2009/0246016 A1* | 10/2009 | Yang | F04D 25/0613 | 415/213.1 |
| 2009/0269195 A1* | 10/2009 | Hsu | F04D 25/0613 | 415/208.2 |
| 2009/0290293 A1* | 11/2009 | Wang | G06F 1/26 | 361/601 |
| 2010/0074746 A1* | 3/2010 | Huang | F04D 25/0613 | 415/220 |
| 2010/0182749 A1* | 7/2010 | Su | H05K 7/20172 | 361/695 |
| 2010/0284149 A1 | 11/2010 | Su | | |
| 2011/0030930 A1* | 2/2011 | Yu | H01L 23/467 | 165/121 |
| 2015/0044076 A1* | 2/2015 | Huang | F04D 25/082 | 417/354 |
| 2015/0050133 A1* | 2/2015 | Jiang | F04D 29/388 | 415/183 |
| 2015/0377564 A1* | 12/2015 | Yang | F28F 3/02 | 165/185 |
| 2015/0382500 A1* | 12/2015 | Chen | G06F 1/20 | 165/121 |
| 2017/0146032 A1* | 5/2017 | Lin | F04D 25/0606 | |

* cited by examiner

POWER SUPPLY

FIELD OF THE INVENTION

The present invention is related to a power supply, particularly to a power supply using a heat-dissipating fan without a barrier wall around a fan blade set.

BACKGROUND OF THE INVENTION

At present, each of all power supplies used in personal computers includes a fan for heat-dissipation. The general arrangement of the fan is disclosed in patents, such as US 20090290293, US 20100284149, US 20080266793, U.S. Pat. No. 6,074,296 and so on.

It may be clearly understood that, from patents listed above, each of all currently used fans is provided with an outer frame, via which the fan is mounted on a housing of the power supply. Additionally, a flow-guiding channel, provided for a fan blade set to be suspended therein, is further delimited by the outer frame, such that heat-dissipating airflow generated by the fan is discharged through the flow-guiding channel.

In this manner, although heat-dissipating airflow generated by the fan is collected, the heat-dissipating airflow is allowed to only dissipate heat locally in disguise without providing heat-dissipation for each element within the power supply effectively. Thus, effect of heat-dissipation is reduced.

SUMMARY OF THE INVENTION

It is the main object of the present invention to solve the problem of reduced effect of heat-dissipation due to an outer frame generally provided for a fan used in a power supply.

For achieving the above object, the present invention provides a power supply, including a bottom case, a top cover, a circuit board and a heat-dissipating fan. The bottom case and the top cover are fitted together to delimit an accommodating space. The circuit board is mounted on the bottom case and located within the accommodating space. The circuit board is provided thereon with a plurality of electronic components and a plurality of heat-dissipating elements, each of the plurality of heat-dissipating element being provided correspondingly to one of the plurality of electronic components and allowed to conduct heat, respectively. Each of the plurality of heat-dissipatings elements is provided with a mounting hole. The heat-dissipating fan includes a supporting frame, a driving module provided on the supporting frame, and a fan blade set covering the driving module and being driven by the driving module to rotate. The supporting frame is presented as a flat plate and provided with a plurality of connecting ribs, each of the plurality of connecting ribs being respectively connected to one of the mounting holes. Moreover, the heat-dissipating fan is not provided with a barrier wall around the fan blade set.

In one embodiment, the mounting hole is replaced by a gap formed between a plurality of fins on each of the plurality of heat-dissipating elements.

In one embodiment, lines interconnecting positions where the mounting holes are located are formed as a polygon.

In one embodiment, the plurality of heat-dissipating elements are of equal height, in such a way that top edges of the plurality of heat-dissipating elements are located on overlapping parallel lines, and each of the mounting holes is respectively located on the top edge of each of the plurality of heat-dissipating elements.

In one embodiment, the top cover is provided with at least one vent facing the heat-dissipating fan.

Besides, the present invention also provides a power supply, the power supply including a bottom case, a top cover, a circuit board and a heat-dissipating fan. The bottom case and the top cover are fitted together to delimit an accommodating space. The circuit board is mounted on the bottom case and located within the accommodating space. The heat-dissipating fan includes a supporting frame, a driving module provided on the supporting frame, and a fan blade set covering the driving module and being driven by the driving module to rotate. The supporting frame is provided with a main body provided for the driving module and the fan blade set to be installed, as well as a plurality of supporting posts connected to the main body and fixed on the circuit board, respectively. The supporting frame is not provided with a barrier wall around the fan blade set.

In one embodiment, the top cover is provided with at least one vent facing the heat-dissipating fan.

In one embodiment, each of the plurality of supporting posts and the main body are two members, which may be separated from each other.

In one embodiment, lines interconnecting positions where the plurality of supporting posts are located on the circuit board are formed as a polygon.

In one embodiment, the supporting frame is provided with a plurality of connecting ribs, each of the plurality of connecting ribs being respectively provided between two adjacent of the plurality of supporting posts.

In comparison with the conventional art, the feature obtained by what is disclosed above in the present invention is as follows: the heat-dissipating fan disclosed in the present invention being not provided with a barrier wall around the fan blade set. In other words, the heat-dissipating fan of the present invention is not provided with an outer frame. Thus, the heat-dissipating airflow generated by the heat-dissipating fan is not restricted by the outer frame any more in the present invention, while heat dissipation in relation to each of the plurality of electronic components or member within the accommodating space is allowed so as to further enhance effect of heat-dissipation in comparison with the conventional art. On the other hand, the heat-dissipating fan of the present invention is not provided with an outer frame so as to decrease the noise produced by the heat-dissipating fan from working.

DETAILED DESCRIPTION OF THE PREFERRED EMBODIMENTS

Figure 1:
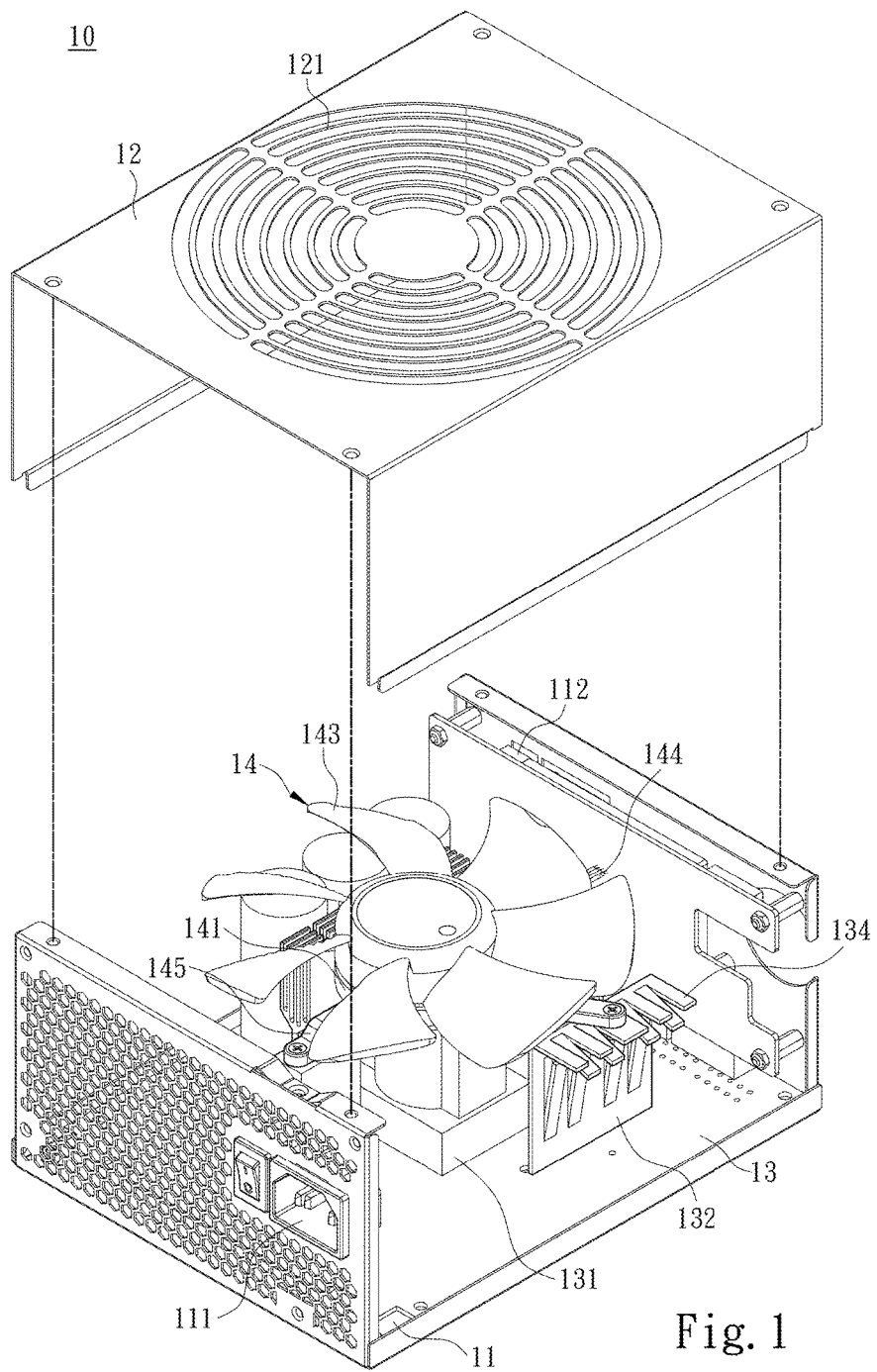
FIG. 1 is an exploded diagram of a power supply of one embodiment of the present invention.

The detailed description and technical content related to the present invention is described in accompany with the drawings as follows.

Referring to FIG. 1, FIG. 2, FIG. 3, FIG. 4, FIG. 5, the present invention provides a power supply 10. The power supply 10 may be implemented according to the ATX specification. The power supply 10 includes a bottom case 11, a top cover 12, a circuit board 13 and a heat-dissipating fan 14. In this case, the bottom case 11 and the top cover 12 may be presented in the form of a mutually fitted structure. In one embodiment, each of the bottom case 11 and the top cover 12 is formed as U-shaped structure, respectively, such that the bottom case 11 and the top cover 12 are fitted together to delimit an accommodating space 15. Further, the top cover 12 may be provided with a vent 121. Next, in the present invention, the bottom case 11 and the top cover 12 may be implemented with many components according to the design. Furthermore, the bottom case 11 may be further mounted at the sides thereof with a power input port 111 and at least one power output port 112. The power input port 111 and the power output port 112 are provided at different sides of the bottom case 11. The number of the power output ports 112 may be modified as required for implementation.

Figure 2:
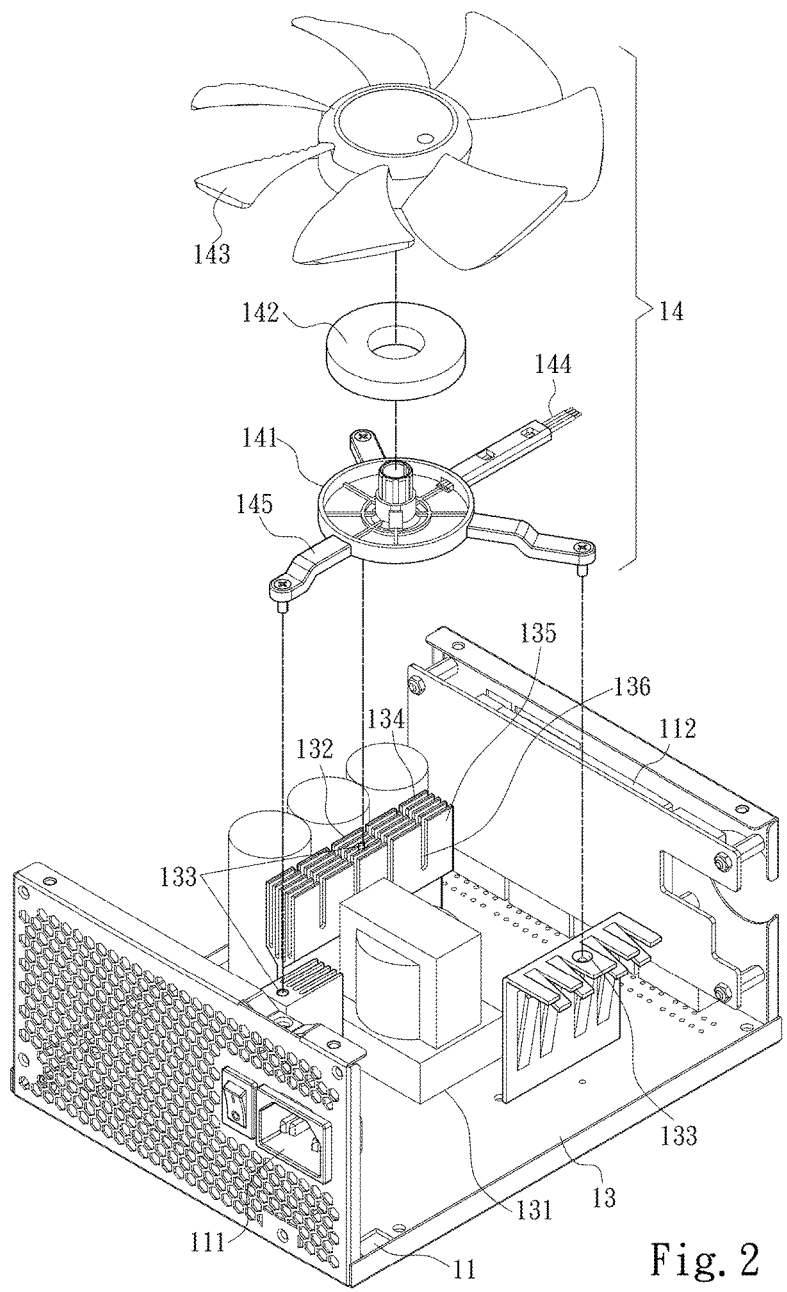
FIG. 2 is an exploded diagram of a partial structure of the power supply of the embodiment of the present invention.
Figure 3:
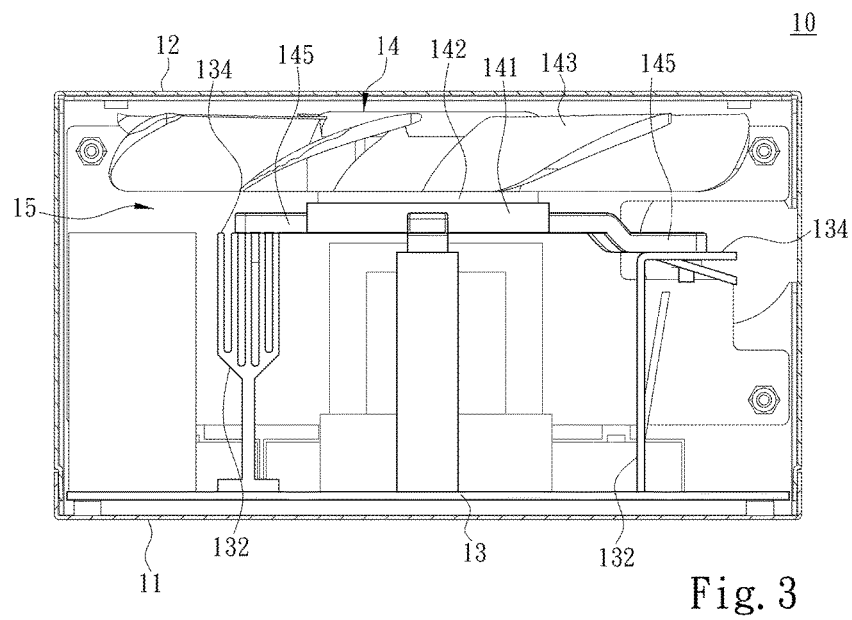
FIG. 3 is a structural cross-section view of the power supply of the embodiment of the present invention.
Figure 4:
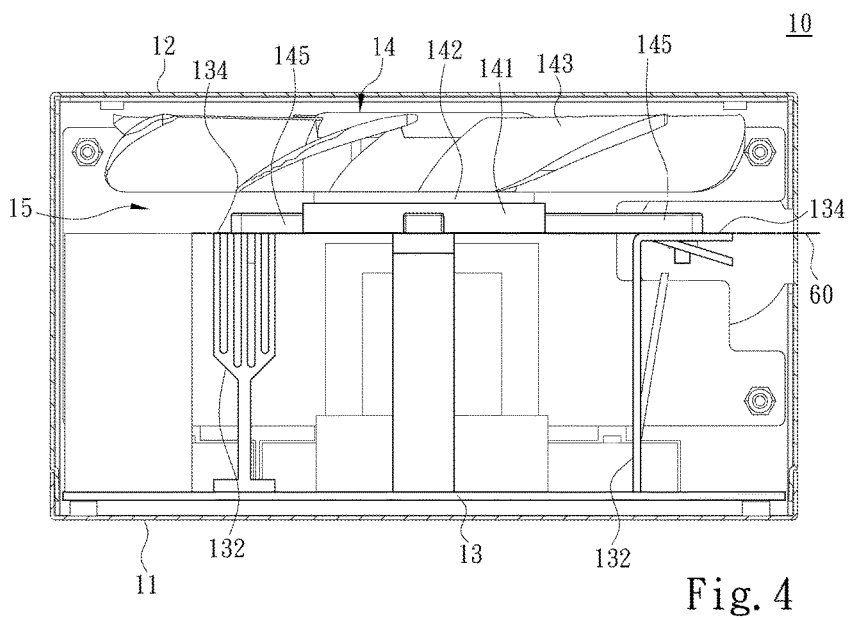
FIG. 4 is a structural cross-section view of a power supply of another embodiment of the present invention.

Next, the circuit board 13 is mounted on the bottom case 11 and located within the accommodating space 15. The circuit board 13 is laid thereon with a plurality of electronic components 131 and a plurality of heat-dissipating elements 132, each of the plurality of heat-dissipating elements 132 being provided correspondingly to one of the plurality of electronic components 131, respectively. In this case, the plurality of electronic components 131 are combined as at least a power calibration circuit, an electric power conversion circuit and etc., after being arranged. Further, each of plurality of the heat-dissipating elements 132 is contacted with one of the plurality of electronic components 131, to which each of the plurality of heat-dissipating elements 132 is provided correspondingly, so as to conduct heat. Each of the plurality of heat-dissipating elements 132 is provided with a mounting hole 133. In one embodiment, the plurality of heat-dissipating elements 132 are of equal height, in such a way that top edges 134 of the plurality of heat-dissipating elements 132 are located on overlapping parallel lines 60. Moreover, each of the mounting holes 133 is located on the top edge 134 of each of the plurality of heat-dissipating elements 132, respectively. Furthermore, the mounting hole 133 referred to in the present invention may be replaced by a gap 136 formed between a plurality of fins 135 on the plurality of heat-dissipating elements 132, just as illustrated in FIG. 2.

Furthermore, the heat-dissipating fan 14 of this embodiment includes a supporting frame 141, a driving module 142 provided on the supporting frame 141, and a fan blade set 143 covering the driving module 142 and being driven by the driving module 142 to rotate. The heat-dissipating fan 14 is further connected to a power feeder (not illustrated in this figure) on the circuit board 13 via a power line 144, so as to acquire electric power required for rotation. Further, the driving module 142 is implemented as an electric motor configuration. Additionally, the supporting frame 141 of the present invention is presented as a flat plate and provided with a plurality of connecting ribs 145, each of the plurality of connecting ribs 145 being connected to one of the mounting holes 133, respectively. The pattern of each of the plurality of connecting ribs 145 may be modified in accordance with the position or pattern of each of the plurality of heat-dissipating elements 132 on which the mounting hole 133 is provided. Further, the heat-dissipating fan 14 of the present invention is not provided with a barrier wall, which is provided around the fan blade set 143. In other words, the heat-dissipating fan 14 is not provided with a flow-limiting channel, which is delimited by an outer frame and in which the fan blade set 143 is suspended. In this way, the heat-dissipating fan 14 is allowed for generating heat-dissipating airflow within the accommodating space 15 more specifically when operated electrically, so as to enhance the heat-dissipation performance.

Figure 5:
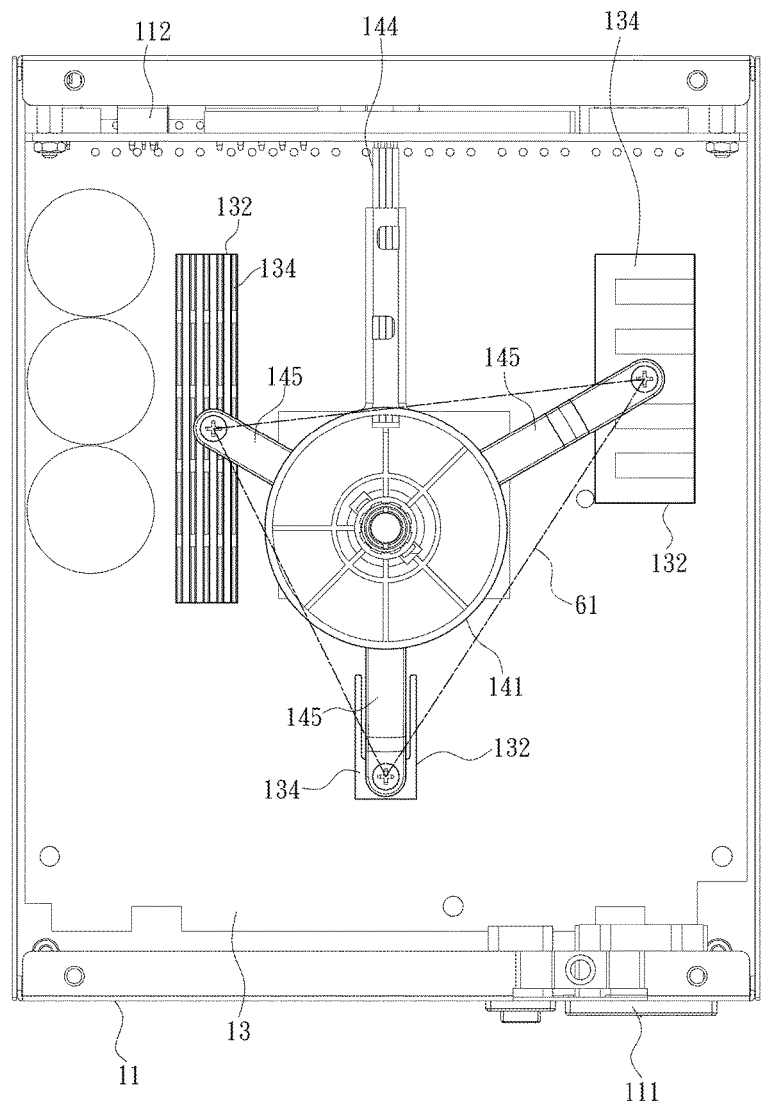
FIG. 5 is a top view of a partial structure of a power supply of one embodiment of the present invention.

In one embodiment, referring to FIG. 5, for the enhancement of stability of the heat-dissipating fan 14 during rotation, the mounting holes 133 may be mapped out, such that a polygon 61 is formed by lines interconnecting positions where the mounting holes 133 are located. In this way, the heat-dissipating fan 14 may be supported more stably, so as to reduce the possibility of sway of the heat-dissipating fan 14 during rotation. Nevertheless, the amount of the mounting hole 133 used in the embodiment of the present invention may be, for example but not limited to, three. Other appropriate amount of the mounting hole 133 is also applicable in the present invention.

Figure 6:
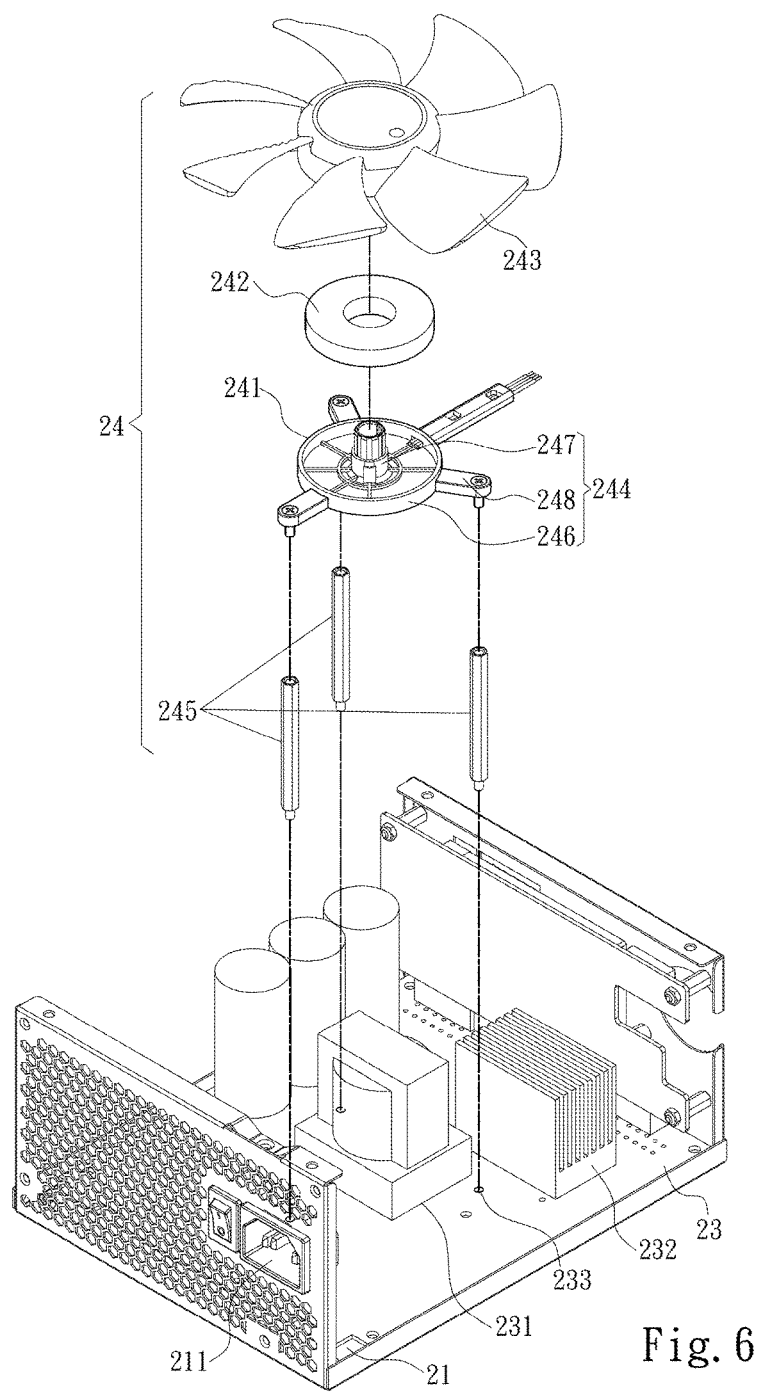
FIG. 6 is an exploded diagram of a partial structure of a power supply of another embodiment of the present invention.
Figure 7:
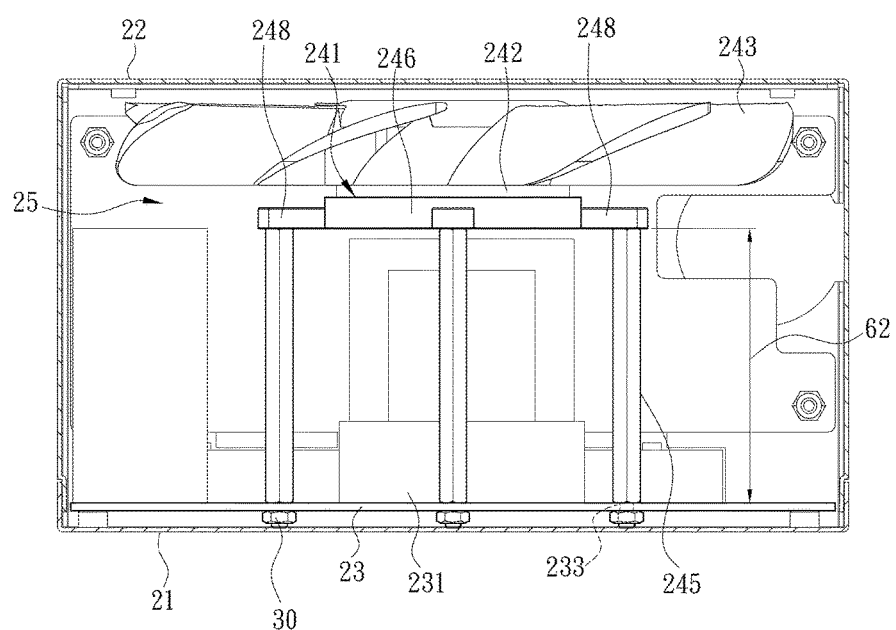
FIG. 7 is a structural cross-section view of the power supply of another embodiment of the present invention.
Figure 10:
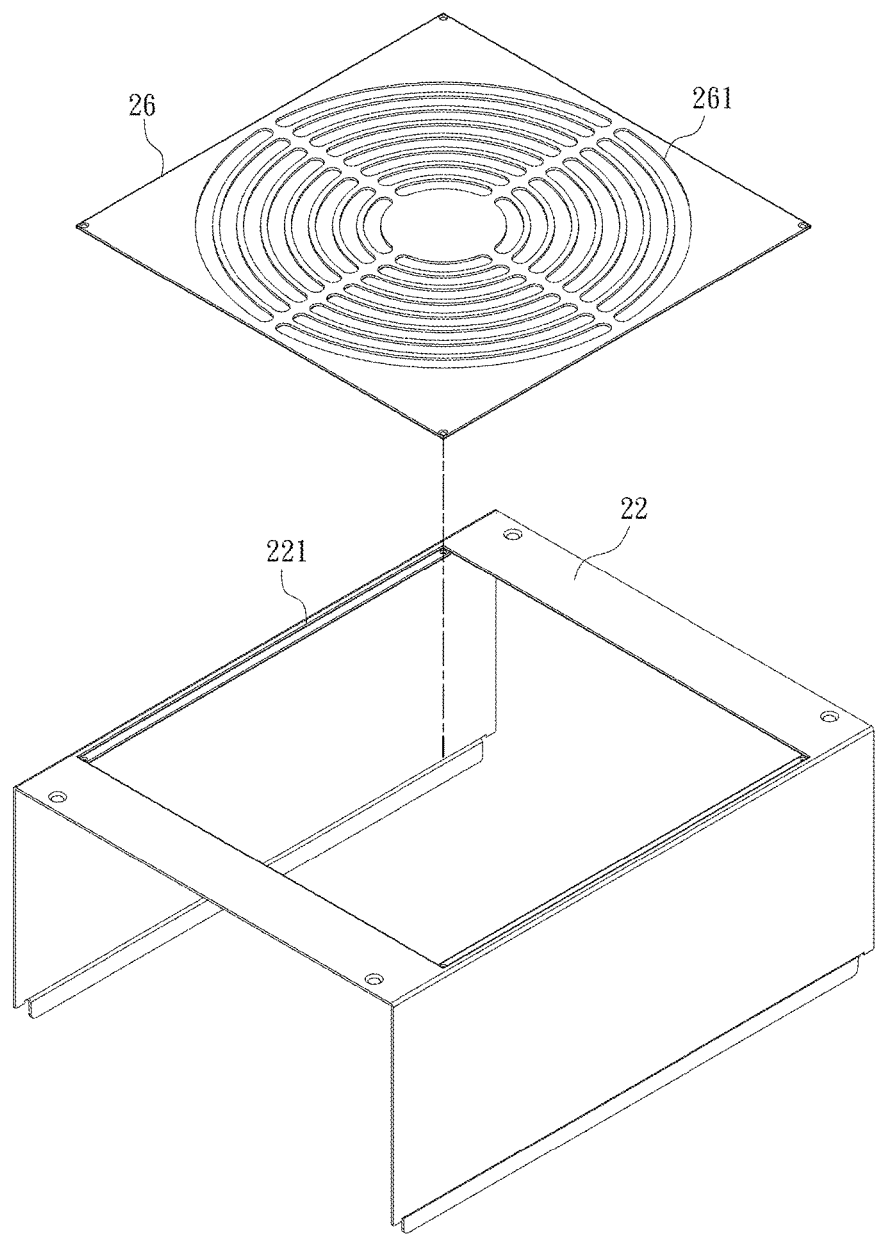
FIG. 10 is an exploded diagram of a top cover of another embodiment of the present invention.

Referring to FIG. 6, FIG. 7 and FIG. 10, another embodiment is also proposed, besides the above power supply 10, in the present invention. Different numerals are used below, however, for distinguishing between the two embodiments. In this embodiment, the power supply 20 includes a bottom case 21, a top cover 22, a circuit board 23 and a heat-dissipating fan 24. In this case, the bottom case 21 and the top cover 22 are fitted together to delimit an accommodating space 25. The top cover 22 may be provided with at least one vent 221 facing the heat-dissipating fan 24. Further, the circuit board 23 is mounted on the bottom case 21 and located within the accommodating space 25. The circuit board 23 is laid with a plurality of electronic components 231 and the plurality of heat-dissipating elements 232 as required for implementation. The electronic components 231 are combined as a power calibration circuit, an electric power conversion circuit and etc., after being arranged. Moreover, the plurality of heat-dissipating elements 232 may be laid as required for implementation.

Further, the heat-dissipating fan 24 includes a supporting frame 241, a driving module 242 provided on the supporting frame 241, and a fan blade set 243 covering the driving module 242 and being driven by the driving module 242 to rotate. In this embodiment, the supporting frame 241 is provided with a main body 244 provided for the driving module 242 and the fan blade set 243 to be installed, as well as a plurality of supporting posts 245 connected to the main body 244 and fixed on the circuit board 23, respectively. More specifically, the main body 244 is presented as a flat plate. The main body 244 is provided with at least a flat portion 246 provided for the driving module 242 to be placed, as well as a protruding portion 247 connected to the flat portion 246 and located at the center of the main body 244 for the fan blade set 243 to be fitted. In one embodiment, the main body 244 further includes a plurality of connecting portions 248 extending from the edge of the flat portion 246, respectively. Each of the connecting portions 248 is corresponded to one of the plurality of supporting posts 245, respectively. Next, the circuit board 23 is provided with a plurality of through-holes 233 provided for the plurality of supporting posts 245 to be installed, respectively. Moreover, the main body 244 is held up by the plurality of supporting posts 245 together, such that the main body 244 is installed at a height 62 relative to the circuit board 23, in which each of the plurality of supporting posts 245 is at least higher than the highest one of the electronic components 231. Moreover, each of the plurality of supporting posts 245 and the main body 244 are two members, which may be separated from each other. Furthermore, the heat-dissipating fan 24 of this embodiment is not provided with a barrier wall, which is provided around the fan blade set 243; that is to say, the heat-dissipating fan 24 is not provided with a flow-limiting channel, which is delimited by an outer frame and in which the fan blade set 243 is suspended.

Figure 8:
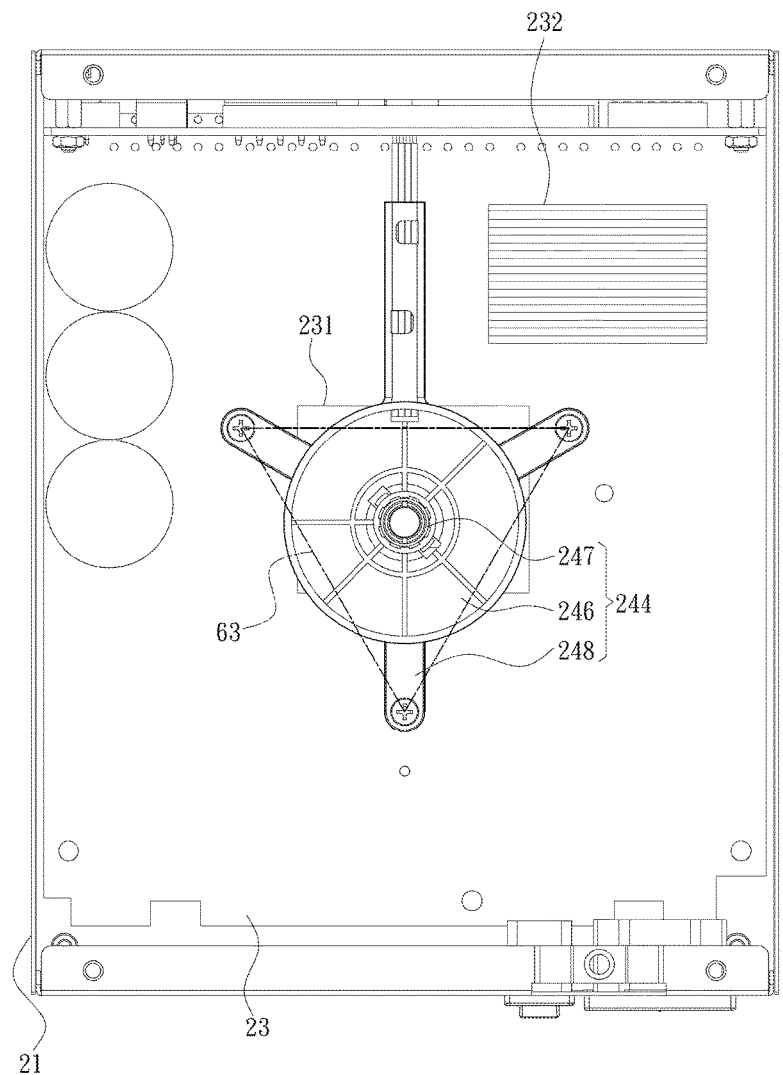
FIG. 8 is a top view of a partial structure of a power supply of another embodiment of the present invention.
Figure 9:
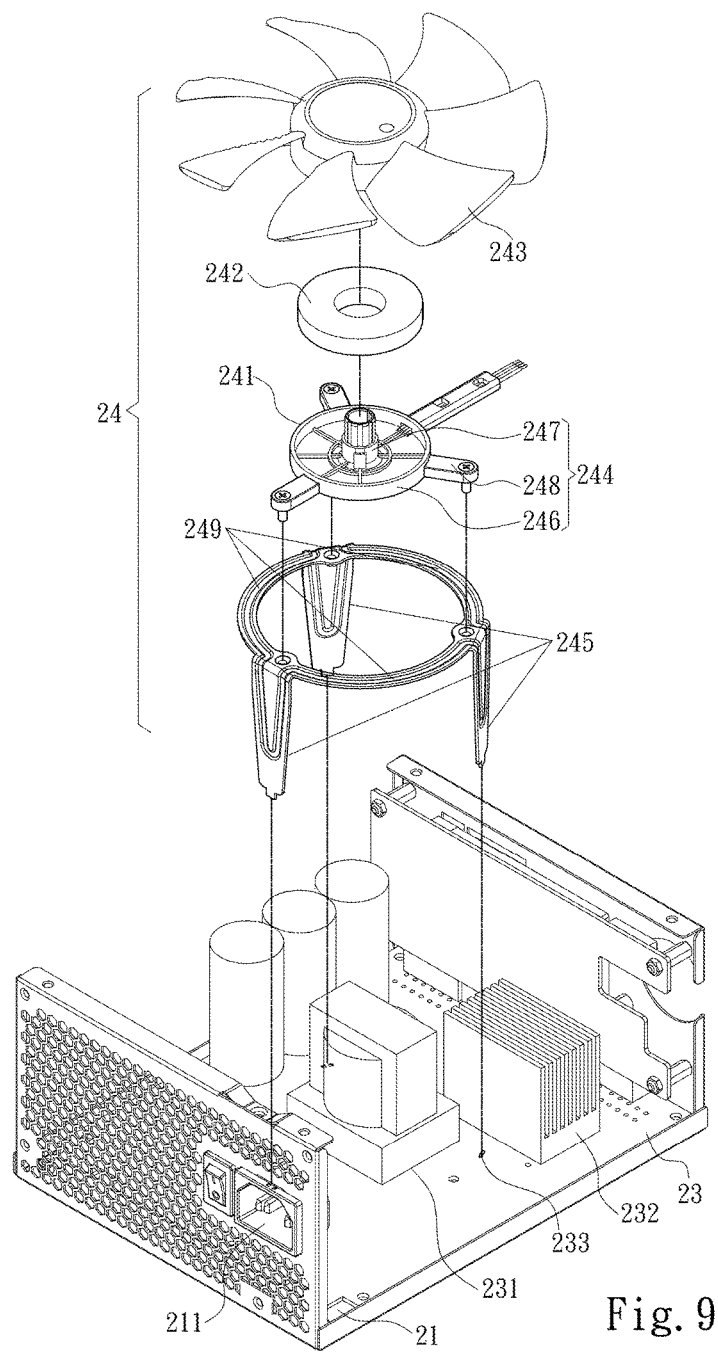
FIG. 9 is an exploded diagram of a structure of a power supply of another embodiment of the present invention.

In one embodiment, referring to FIG. 7 and FIG. 8, for the enhancement of stability of the heat-dissipating fan 24 during rotation, the positions where the plurality of supporting posts 245 are located on the circuit board 23 may be mapped out, such that a polygon 63 is formed by lines interconnecting positions where the plurality of supporting posts 245 are located on the circuit board 23. Nevertheless, the amount of the supporting post 245 used in the embodiment may be, for example but not limited to, three. Other appropriate amount of the supporting post 245 is also applicable in the present invention. Furthermore, a fixing component 30 is further implemented with each of the plurality of supporting posts 245, and fixing each of the plurality of supporting posts 245 on the circuit board 23, wherein the fixing component 30 may be a nut, a screw, and so on. In addition, referring to FIG. 9, the supporting frame 241 in one embodiment may be provided with a plurality of connecting ribs 249, each of the plurality of connecting ribs 249 being provided between two adjacent of the plurality of supporting posts 245, respectively. The plurality of connecting ribs 249 may be provided for enhancing the structural strength of the plurality of supporting posts 245. The pattern of the plurality of connecting ribs 249 may be modified as required for implementation.

Additionally, the top cover 22 is provided thereon with at least one vent 221 facing the heat-dissipating fan 24. In one embodiment, the top cover 22 is provided thereon with the vents 221, and the vents 221 may be laid out and then formed in accordance with a designed pattern. In addition, it is also possible to modify the opening area of the vent 221 provided on the top cover 22 as required for implementation, such that the vent 221 may be provided for a decorative baffle 26 to be installed therein. The decorative baffle 26 may be provided with a plurality of air-permeable holes 261, which are cuttingly provided in accordance with a designed pattern, just as illustrated in FIG. 10. In this embodiment, moreover, the power supply 20 is provided for a user with a choice among a variety of the decorative baffles 26 on the basis of personal preference.

What is claimed is:

1. A power supply, comprising:
   a bottom case and a top cover, said bottom case and said top cover being fitted together to delimit an accommodating space;
   a circuit board, mounted on said bottom case and located within said accommodating space, said circuit board being provided thereon with a plurality of electronic components and a plurality of heat-dissipating elements, each of said plurality of heat-dissipating elements being provided correspondingly to one of said plurality of electronic components and allowed to conduct heat, respectively, each of said plurality of heat-dissipating elements being provided with a mounting hole; and
   a heat-dissipating fan, including a supporting frame, a driving module provided on said supporting frame, and a fan blade set covering said driving module and being driven by said driving module to rotate, said supporting frame being presented as a flat plate and provided with a plurality of connecting ribs, each of the plurality of connecting ribs being respectively connected to one of said mounting holes, said heat-dissipating fan being not provided with a barrier wall around said fan blade set.

2. The power supply according to claim 1, wherein said mounting hole is replaced by a gap formed between a plurality of fins on said plurality of heat-dissipating elements.

3. The power supply according to claim 1, wherein lines interconnecting positions where said mounting holes are located are formed as a polygon.

4. The power supply according to any one of claim 3, wherein said plurality of heat-dissipating elements are of equal height, in such a way that top edges of said plurality of heat-dissipating elements are located on overlapping parallel lines, and each of said mounting holes is respectively located on said top edge of each of said plurality of heat-dissipating elements.

5. The power supply according to claim 1, wherein said top cover is provided with at least one vent facing said heat-dissipating fan.

\* \* \* \* \*